(12) United States Patent  
Kendall

(10) Patent No.: US 6,465,782 B1  
(45) Date of Patent: Oct. 15, 2002

(54) STRONGLY TEXTURED ATOMIC RIDGES AND TIP ARRAYS

(75) Inventor: Don L. Kendall, Albuquerque, NM (US)

(73) Assignee: StarMega Corporation, Albuquerque, NM (US)

(*) Notice: Subject to any disclaimer, the term of this patent is extended or adjusted under 35 U.S.C. 154(b) by 29 days.

(21) Appl. No.: 09/658,878

(22) Filed: Sep. 8, 2000

Related U.S. Application Data

(60) Provisional application No. 60/153,088, filed on Sep. 10, 1999.

(51) Int. Cl.[7] .......................... G01N 23/00; G21B 7/00
(52) U.S. Cl. ........................................ 250/306
(58) Field of Search .................. 250/306, 442.11, 250/307, 492.2; 216/2, 62; 428/321.1; 318/592; 365/151; 438/510

(56) References Cited

U.S. PATENT DOCUMENTS

| | | | |
|---|---|---|---|
| 4,983,540 A | | 1/1991 | Yamaguchi et al. |
| 4,987,094 A | | 1/1991 | Colas et al. |
| 5,053,995 A | * | 10/1991 | Kajimura et al. .......... 365/151 |
| 5,258,326 A | | 11/1993 | Morishima et al. |
| 5,296,719 A | | 3/1994 | Hirai et al. |
| 5,300,452 A | | 4/1994 | Chang et al. |
| 5,327,675 A | | 7/1994 | Butler et al. |
| 5,360,978 A | * | 11/1994 | Gueret ...................... 250/306 |
| 5,372,675 A | | 12/1994 | Wakabayashi et al. |
| 5,482,890 A | | 1/1996 | Lin et al. |
| 5,567,954 A | | 10/1996 | Dobson et al. |
| 5,612,255 A | | 3/1997 | Chapple-Sokol et al. |
| 6,066,265 A | * | 5/2000 | Galvin et al. ................ 216/2 |
| 6,100,524 A | * | 8/2000 | Yagi et al. .................. 250/306 |

OTHER PUBLICATIONS

Baski et al. A Stable High–Index Surface of Silicon, Si (5 5 12), Science, vol. 269, Issue 5230 Sep. 15, 1995, Pp 1556–1560.*

Erwin et al. Structure and Stability of Si (1 1 14)–(2×1), Physical Review Letters, vol. 77 No. 4 22 Jul. 1996, pp 687–690.*

Jones et al. Noble Metal Growth on Si (5 5 12) Submitted to World Scientific on Feb. 24, 2000.*

Baski et al, STM Studies of 1–D Noble Metals Growth on Silicon, Submitted to Ultramicroscopic (Heidelberg 200) on Jul. 3, 2000.*

Kendall, Don L., "Far Beyond Microelectronics with Silicon (Top Ten Speculations from Bulk Micromachining).".

* cited by examiner

*Primary Examiner*—Jack Berman  
*Assistant Examiner*—Johnnie L Smith, II  
(74) *Attorney, Agent, or Firm*—Jagtiani + Guttag

(57) ABSTRACT

The present invention provides a multi-tip array device comprising: a substrate; a multi-tip array of atomic tips on the substrate, the multi-tip array having a pitch of 0.94 to 5.4 nm between adjacent tips in at least one direction; and means for moving the substrate. The present invention also provides an atomic claw comprising: a mounting block; a paddle having a multi-tip array thereon, the multi-tip array having a pitch of 0.94 to 5.4 nm between adjacent tips in at least one direction; and a cantilever connected to the paddle and the mounting block, wherein the cantilever allows the paddle to be moved in at least one arcuate direction.

8 Claims, 4 Drawing Sheets

STRONGLY TEXTURED ATOMIC RIDGES AND TIP ARRAYS

CROSS-REFERENCE TO RELATED APPLICATIONS

This application makes reference to the following U.S. Patent Applications: U.S. Provisional Patent Application No. 60/153,088, filed Sep. 10, 1999 and U.S. patent application Ser. No. 09/187,730, entitled "QUANTUM RIDGES AND TIPS" filed Nov. 9, 1998, U.S. patent application Ser. No. 09/657,533 entitled "STRONGLY TEXTURED ATOMIC RIDGE AND DOT FABRICATION", filed Sep. 8, 2000 and U.S. patent application Ser. No. 09/658,599 entitled "STRONGLY TEXTURED ATOMIC RIDGE AND DOT MOSFETS, SENSORS, AND FILTERS", filed Sep. 8, 2000, the entire disclosure and contents of which are hereby incorporated by reference.

BACKGROUND OF THE INVENTION

1. Field of the Invention

The present invention relates generally to movable multi-tip arrays.

2. Description of the Prior Art

Currently available movable multi-tip arrays include Ultrasharp calibration gratings having tip sizes of 10 nm and tip spacings of 1 to 10 µm. While such multi-tip arrays may be useful for purposes such as calibration gratings, if multi-tip arrays could be made having tips sizes and spacings 100 to 10,000 times smaller, such multi-tip arrays could be used for many more applications such as for use in lithography processes, chemical sensors, nano-circuits, DNA manipulation, and much more.

SUMMARY OF THE INVENTION

According to first broad aspect of the present invention, th ere is provided a multi-tip array device comprising: a substrate; a multi-tip array of atomic tips on the substrate, the multi-tip array having a pitch of 0.94 to 5.4 nm between adjacent tips in at least one direction; and means for moving the substrate.

According to a second broad aspect of the present invention, there is provided an atomic claw comprising: a mounting block; a paddle having a multi-tip array thereon, the multi-tip array having a pitch of 0.94 to 5.35 nm between adjacent tips in at least one direction; and a cantilever connected to the paddle and the mounting block, wherein the cantilever allows the paddle to be moved in at least one arcuate direction.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Figure 1:
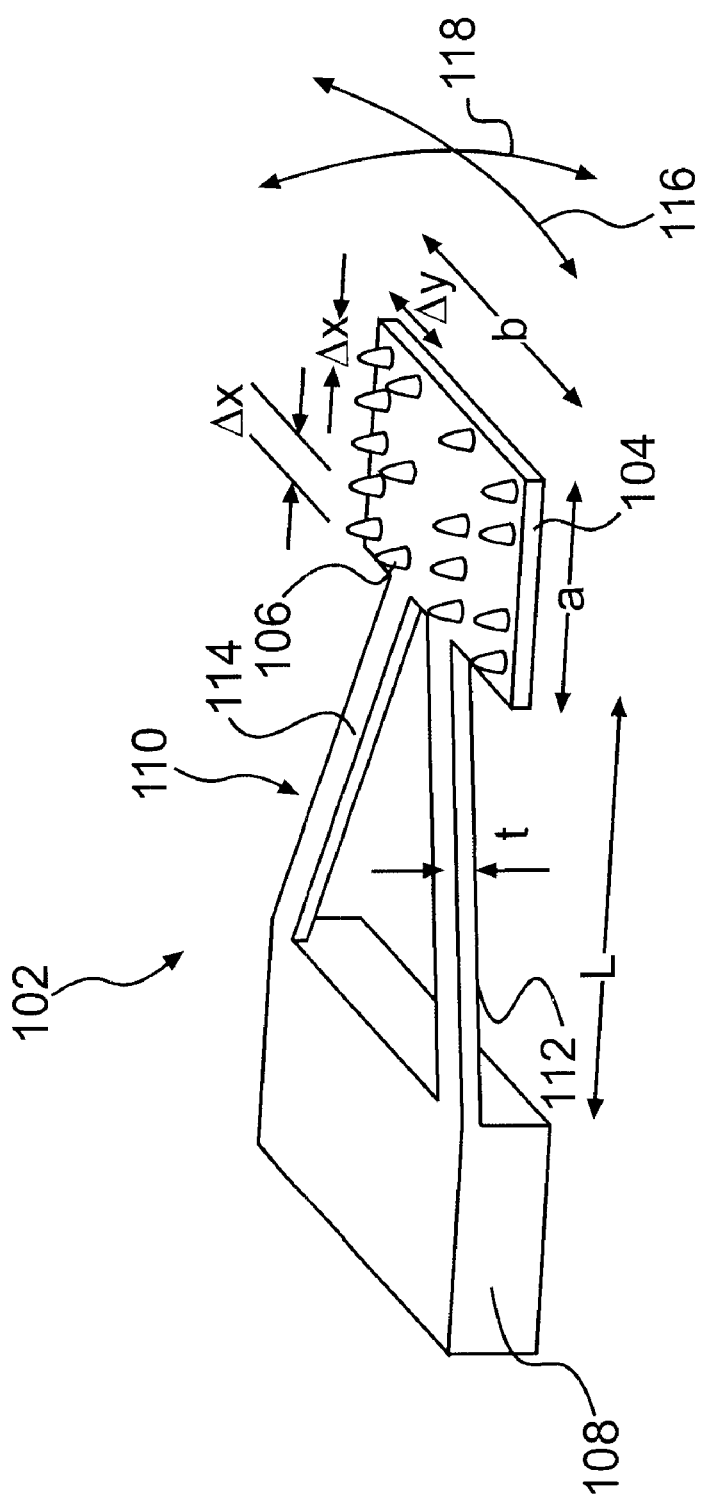
FIG. 1 illustrates in simplified form a perspective drawing of a multi-tip array of the present invention.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "monolayer (ML)" refers to one atomic layer of metal on a surface of a given orientation.

For the purposes of the present invention, the term "Ultra High Vacuum (UHV)" refers to a pressure of less than $1 \times 10^{-9}$ Torr.

For the purposes of the present invention, the term "Reactive Ion Beam Etching (RIBE)" refers to one of the plasma or dry-etching methods that can be used to produce the grooves of this invention.

For the purposes of the present invention, the term "surfactant restructurant" refers to a single element or several elements that help restructure the surface of a substrate used in the formation of grooves, ridges, tips, oxide ridges, nanowires, or other structures of the present invention.

For the purposes of the present invention, the term "nanowire" refers to an overlayer row resulting from the deposition of a metal on the silicon surface. Such a nanowire has a width of ~1 to 4 nm, a length of 10 nm or longer, and a pitch of ~1 to 5 nm.

For the purposes of the present invention, the term "atomic ridge" refers to a ridge formed in the silicon wafer, primarily from an etching procedure following the growth of nanowires.

For the purposes of the present invention, the term "atomic tip" refers to a elevated region having widths of less than 5 nm in both lateral directions.

For the purposes of the present invention, the term "complete array" refers to an array of atomic tips in which all of the atomic tips that form the regular pattern, such as a grid pattern, of the array are present.

For the purpose of the present invention, the term "antitip" refers to a location in an array of atomic tips where a tip that would be part of a complete array of atomic tips is absent.

For the purposes of the present invention the term "pitch" refers to the separation between two adjacent nanowires, atomic ridges, atomic tips or grooves.

For the purposes of the present invention, the term "Molecular Beam Epitaxy (MBE)" refers to the deposition of elements onto a substrate using evaporators in a UHV environment.

For the purposes of the present invention, the term "artificial atom" refers to an atomic tip that differs in some significant way from the atomic tips surrounding it.

For the purposes of the present invention, the term "artificial molecule" refers to two or more artificial atoms that are close to each other and that are surrounded by normal atomic tips.

For the purposes of the present invention, the term "inverse artificial atom" refers to the region of a missing atomic tip in the midst of normal atomic tips.

For the purposes of the present invention, the term "inverse artificial molecule" refers to a regions where two or more closely spaced atomic tips are missing.

For the purposes of the present invention, the term "long chain molecule" refers to molecules like DNA, RNA, etc.

For the purpose of the present invention, the term elongated molecule refers to carbon or other nanotubes.

Description

The atomic dots and tips of the present invention may be formed by any appropriate process for forming atomic ridges described in U.S. patent application Ser. No. 09/187,730 entitled "Quantum Ridges and Tips", filed Nov. 9, 1998, and in the concurrently filed U.S. Patent Application entitled "Strongly Textured Atomic Ridge and Dot Fabrication" and "Strongly Textured Atomic Ridge (STAR) and Dot (STARDOT) MOSFETs, Sensors, and Filters." All of these applications list Don L. Kendall as an inventor and the contents and disclosure of all of these applications are hereby incorporated by reference.

One preferred method of forming atomic tips of the present invention involves first forming atomic ridges. An appropriately oriented sample of Si, a (5 5 12) wafer, is prepared by standard chem-mechanical polishing methods. The wafer is placed in a UHV chamber which is pumped to a vacuum of about $10^{-10}$ torr. The Si is then heated to 1150° C. for a brief period ("flashed") to remove any surface oxides and then cooled to below room temperature (around −20° C.). The heating of the wafer may also be accomplished locally using a focused or beam-expanded laser passing through a quartz window in the MBE machine. This leaves the surface in a stable condition with slightly elevated ridges separated in Å by 16, 22, 16; 16, 22, 16, with this sequence of 54 Å width persisting over significant distances in regions where the heating occurs, and with the ridges also reaching across the whole length of the wafer. The ridges have occasional steps in them along their length due to the slight variations from perfect flatness of the wafer surface, but after each step, the ridges again establish themselves in the same <1 1 0> direction. In addition, there are occasional surface faults in the (5 5 12) sequence that disrupt the regularity of the 16, 22, 16, or 54 Å unit cell, repetitions. These faults have a missing 16 Å section, with the fault then effectively having only a 38 Å section instead of a 54 Å sequence. By contrast, the other good ridge forming plane, the (1 1 4), has very regular 16.3 Å spacing with no surface faults.

Some low melting point metals must be deposited on the crystalline substrates at much lower temperatures (at least as low as 64° K for Rb) to ensure that surface diffusion does not cause the metal to agglomerate and compromise the atomic ridge deposition of the Self Aligned Atomic Shadowing (SALAS) process. Still, other metals have measurable surface diffusion on semiconductor and other crystal surfaces near room temperature and are not good candidates for SALAS process except at very low substrate temperatures. However, a modest heat treatment after room temperature deposition in the UHV/MBE system may sometimes result in well formed ridges on one or more sets of the different ridge-type bonding sites on (1 1x) surfaces. For example, Au will diffuse to such sites at a temperature as low as 250° C., even though the eutectic temperature is 363° C. Subsequent heating to 700° C. or higher may result in Vapor Liquid Solid (VLS) growth of nanostuds and nanowires at positions where a few atoms of Au exists at the Si surface. This may also be done using gas assisted epitaxy using $Si_2H_6$ in the MBE machine.

The wafer is coated by oblique evaporation at a small angle of 1 to 5° (or up to 30° in some cases) with an etch resistant (or in certain nanowire applications "conductive") metal such as Au or Cr, or Al or Be so that the slightly higher (by about 3 Å) ridges are coated preferentially with 6 to 100 Å of the metal relative to the intervening depressions. The wafers are rotated during this process while maintaining the obliquity to improve the uniformity of coverage along the ridges. This rotation also helps to avoid bridging of the metal due to the "lateral needles" that form when evaporating at high obliquity. This rotation may be modified by blocking off the evaporating beam near the sample with a raised barrier along the direction of the atomic ridges so that the evaporation source never is in direct line with the troughs.

The wafers are then removed from the vacuum system and chemically etched a small amount in a solution of ethylene diamine (EDA) and water (54 vol % EDA) (or in a 50 wt % solution of KOH:water), so that about 10 Å of Si is removed from the depressions and the metal serves as an etch mask for the ridges. Since the tilted walls of the grooves are near the {111}, the lateral etching will be markedly slower than the vertical etch. The final result is a Strongly Textured Atomic Ridge (STAR) surface that undulates with an average "wavelength" of the peaks of the ridges of about 18 Å (the average of the 16+22+16 Å sequence on the (5 5 12)). If done on the (1 1 4), the spacing will be 16.3 Å. The Au or Cr (or Be or Al in our first experiments) may then be removed in multiple aqua regia or KCN or other chemical removal steps if desired, for example before passing it on to a MOSFET fabrication cycle. For the MOSFET application the sample is handled like a normal wafer from this point forward, except that the oxidation steps are designed to maintain the STAR surface until the gate dielectric is formed. In a production process, the ridge producing process might also be done only in the gate oxide regions after many of the thick oxide and source and drain implantation and diffusion processes are completed.

The brief etch is designed to leave the metal atomic width "wires" intact along their length, while giving the surface a bit of surface relief which is useful for the next step. In either case, whether the etching step is performed or not, the next step is to use a second single crystal wafer to "cut" the metal "nanowires". Thus, the second wafer would also have regularly spaced atomic ridges, either a pristine freshly "flashed" surface like the one discussed above (before depositing the metal), or one that has been through the whole STAR groove process above. In the preferred method, the metal (or other material) is removed from the second "atomic-cookie-cutter" wafer before using it to cut the nanowires on the first wafer. Finally, the first slightly grooved wafer with the nanowires intact is immersed in a clean HF solution, or dilute HF (1 to 5%), or a dilute HF:ethanol acid bath.

The second wafer may then be aligned perpendicular (or at some other specified angle to the first substrate) and pressed carefully onto the surface of the first wafer. (This is the "crossed wafer" process mentioned earlier). The wafers are allowed to contact each other without any significant lateral shifting by first contacting the flat bottom edges of the otherwise circular wafers and then letting gravity and surface tension close them like closing a book. The Van der Waals forces between the two surfaces then finishes the bonding process so that there is absolutely no lateral shifting, of the wafers. To ensure that the nanowires are completely cut, a weight is then placed on the wafer sandwich while still immersed in the solution.

The wafers are then separated while still in the liquid with a thin wedge inserted into the edge of the wafer stack, again being careful that there is no lateral shifting during the separation (debonding) step. The metal coated bottom wafer is then dipped into DI water for 5 minutes and air dried face up to avoid disturbing the atomic dots that result from this treatment. The metal (or other material) need not be completely removed from the regions cut with the second wafer, but the few monolayers MLs of thickness of the nanowires has been compressed into monolayer thickness regions and squeezed sideways out of the previously continuous nanowires. This squeezing process is adequate to disrupt the conductivity along the atomic wires and make them into "atomic dots", each of which has dimensions of about 4A×14A×20A, where the last number is the approximate thickness of the film and the first 2 numbers are the width and length of the elongated "dots". The most useful thickness range for the q-wire applications is probably between 10 and 30 Å, since below 10A the conductivity will be very poor, and above 30 Å the narrow (say 3 to 6 Å width) wires will tend to delaminate from the substrate ridges. On the other hand, as a temporary etch mask, the useful thickness of the deposited material may be as small as 3 Å, which is of the order of one monolayer ML thickness.

The above steps may also be done in $N_2$, Ar, He, or other inactive gas, as well as in Ultra High Vacuum (UHV), etc., although the procedure in HF or the dilute HF, or HF and ethanol leaves the surface in an H-passivated state, which is an advantage for some applications. The dilute HF mixtures are preferred when the atomic ridge metal is either Be or Al.

Thus, each dot in the above case contains about 56 atoms. This number of atoms in a given "dot" is determined from the atomic density of silicon, which is 0.05 atoms/$Å^3$. However, useful dot sizes will span the range from a single channel wall width (3.14 Å) with a single atom thickness (about 4 atoms) to a dot size of about 50×50×40 or 100.000 $Å^3$ (about 5000 atoms). The latter may seem too large to be called an "atomic dot", but it is still several magnitudes smaller than many of the atomic dots reported in the recent literature. For example, 1000×1000×1000, or $1×10^9$ $Å^3$ ($5×10^7$ atoms) has been shown in proof of principle experiments to have atomic dot properties at temperatures near 1 K. For room temperature operation, the width of the atomic dots are preferably smaller than about 50 Å, which would have a first allowed quantum well energy level of 0.05 eV, which is about 2 kT at 300 K. This magnitude gives the possibility that the thermal energy will not wash out the quantum effects produced by the quantum well. See K. K. Ng, "Complete Guide to Semiconductor Devices", McGraw Hill, N.Y., 1995, pp. 227–228, for the relevant formula, which is $E_n = n^2 K / m_r^* W^2$ where K includes well known physical constants and is 38 eV $Å^2$ when W is in Å, n is an integer, with n=1 for the lowest allowed energy level in the quantum well, and $m_r^*$ is the conductivity effective mass of the carrier relative to the rest mass of the electron, which is 0.26 for the electron and 0.47 for the hole in silicon.

If the "cutting wafer" is the same orientation of the metal coated wafer in the groove, as in the present example, then the dots are separated by an average pitch of about 18 Å in both x and y directions on the (5 5 12), or a spacing of 16.3 Å on the (1 1 4). If the cutting wafer is the (1 1 0), the x-separation will be 5.43 Å, while the y-separation will be the same as before, namely an average of 18 Å or 16.3 Å for the (5 5 12) or the (1 1 4), respectively.

It should be appreciated that all the ranges above refer to Si and must be increased or decreased by up to 30% for other crystals unless otherwise indicated.

The atomic tips of the present invention may also be formed by following the process described above for forming atomic tips, but skipping the light etching step. Such a process is described in U.S. patent application Ser. No. 09/187,730 entitled "Quantum Ridges and Tips", filed Nov. 9, 1998, the entire contents and disclosure of which is hereby incorporated by reference.

When atomic tips are formed on an Si(5 5 12) substrate a the process such as those described above, the tip spacing of 5.4 nm in both the X and Y directions provides a theoretical atomic tip density of about $3×10^{12}/cm^2$. When atomic tips are formed on an Si(1 1 4) substrate using a process such as those described above, the tip spacing of 1.63 nm provides a theoretical atomic tip density of about $4×10^{13}/cm^2$. When atomic tips are formed on an Si(1 1 2) substrate using a process such as those described above, the tip spacing in both the X and Y directions provides a theoretical atomic tip density of about $1×10^{14}/cm^2$. Based on these theoretical tip densities, multi-tip arrays (MTA) on the (5 5 12) that are 10 $\mu m×10 \mu m$ in size can have about $3×10^6$ atomic tips and may be readily produced by the method of the present invention. However, for special applications, still larger total tip counts may be produced using Si(1 1 4) and Si(1 1 2) substrates.

FIG. 1 illustrates an atomic claw 102 of the present invention. Atomic claw 102 includes a paddle 104 including a multi-tip array 106 that may be formed in the manner described above. Paddle 104 is connected to a mounting block 108 by a cantilever 110 including two arms 112 and 114. Cantilever 110 is preferably made of Si and is flexible enough so that paddle 104 may be moved in an arc 116 in the plane of paddle 104. Cantilever 110 is also sufficiently flexible to allow paddle 104 to move back and forth in an arc 118 in a plane perpendicular to the plane of paddle 104. Paddle 104 has a length a of preferably 1 to 20 $\mu m$, and a width b of 1 to 20 $\mu m$. When cantilever 110 is made of Si, cantilever 110 has thickness t of 5 to 500 nm and a length L of 50 to 100 $\mu m$.

The atomic claw of the present invention may be designed to be mounted in devices for manipulating conventional AFM (atomic force microscopy) probes or a similar type of device, such as the devices for manipulating AFM probes described in U.S. Pat. Nos. 5,959,957; 6,066,265; 6,100,524 the entire disclosure and contents of which are hereby incorporated by reference. Furthermore, the mounting block and cantilever may be made using the conventional methods of forming mounting blocks and cantilevers for AFM probes such as the methods described in U.S. Pat. Nos. 5,959,957; 6,066,265; 6,100,524 the entire disclosure and contents of which are hereby incorporated by reference. The paddle of the atomic claw of the present invention may be moved by conventional means such as capacitive, piezoelectric, temperature effects using diffused resistors, or other known methods.

A 10 $\mu m×10 \mu m$ array size is consistent with a readily obtainable size of ultraflat regions produced by using depression patterning and conditioning of a Si substrate. In depression patterning, light assisted chemical etch (LACE) process, an E-beam process, or FIB/GAE, may be performed to produce convex regions at desired locations in the depression patterning process. Depression patterning may also be done using a chemical etching process along the lines described in U.S. patent application Ser. No. 09/187,730, filed Nov. 9, 1998, the entire contents and disclosure of which is hereby incorporated by reference. Any of these localized etching process may be followed by a brief CMP touch up process, if desired.

The convex regions of the treated substrate may then be conditioned to be atomically flat (1 1 X) over tens of microns using Ar ion bombardment at 825 to 900° C. for 1 to 5 minutes or allowing molecular oxygen to impinge on the surface at a pressure of $10^{-8}$ torr at 825 to 900° C. for 1 to 5 minutes. Another way to condition the convex regions to make them atomically flat is to heat the substrate in ultrahigh vacuum (UHV) at about 1200° C. for several hours, but using a processes having an operating temperature less than 975° C. are preferred in most cases to avoid plastic deformation of Si.

The neighboring flat regions in which the multi-tip arrays are formed do not have to be exactly in the same plane for the multi-tip arrays to be useful, since the multi-tip arrays may be easily adjusted to the position of the individual flat regions across a Si substrate. For particular applications, such as the fabrication of X-ray diffraction gratings, it may be possible to produce neighboring flat regions in exactly the same atomic plane using Low Energy Electron Microscopy, LEEM, regions while doing the ultraflat-region processing described above.

A multi-tip array of the present invention may have various tips removed by e-beam, FIB, FIB/GAE using conventional means such as an atomic-SCULPT tool to provide a multi-tip array with a specific pattern of tips. However, other methods may be employed to remove undesirable tips.

Figure 2A:
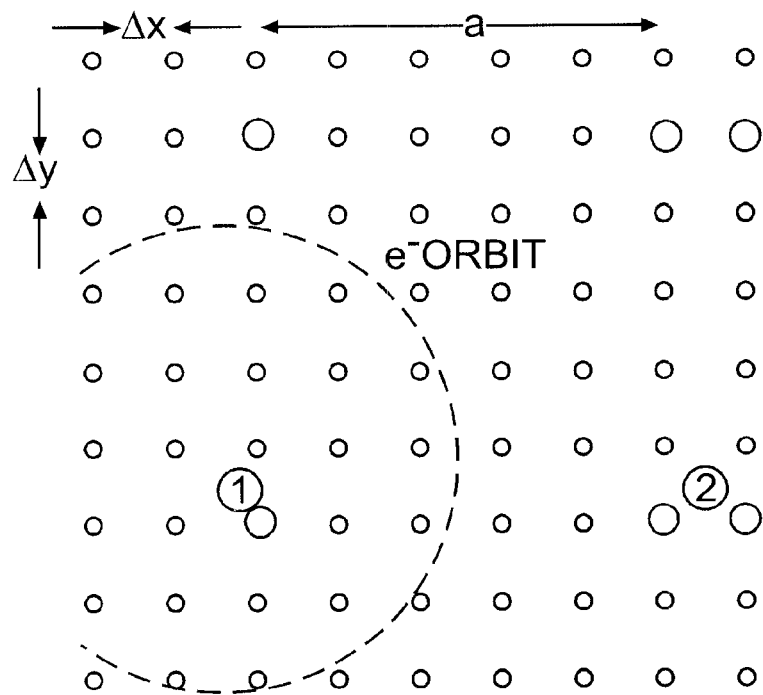
FIG. 2A is a simplified plan view in simplified form of a section of a multi-tip array of the present invention that includes artificial atoms and artificial diatomic molecules.
Figure 2B:
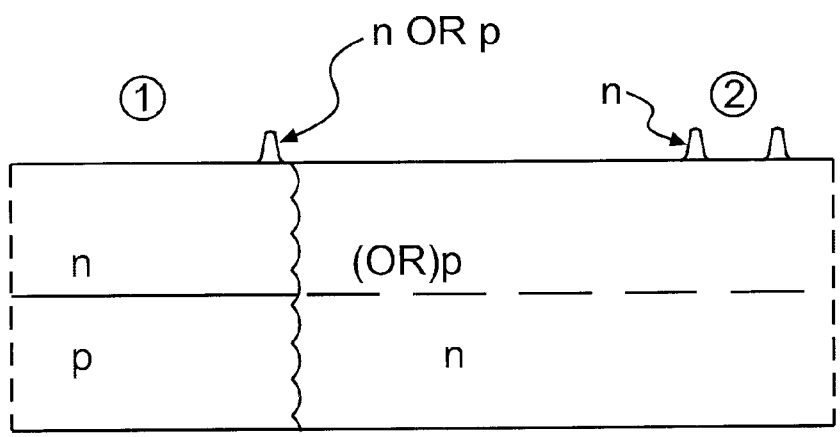
FIG. 2B is a cross-sectional view of the section of the multi-tip array of FIG. 2A.

FIGS. 2A and 2B illustrate a multi-tip array in a regular grid pattern in which undesirable tips have been removed. The single and double tips left behind on the multi-tip array form artificial H atoms and $H_2$ molecules, respectively. By forming different patterns, more complex artificial molecules and a greater variety of artificial molecules may be produced using the method of the present invention. Different coatings or pretreatments on the tips may provide different characteristics. Different spacings between the individual groups of tips may also provide different characteristics. As shown in FIG. 2B, the tips may be n-type semiconductors and the substrate a p-type semiconductor or the tips may be a p-type semiconductor and the substrate an n-type semiconductor. Alternatively, the tips and substrate may be the same type of semiconductor.

Figure 3A:
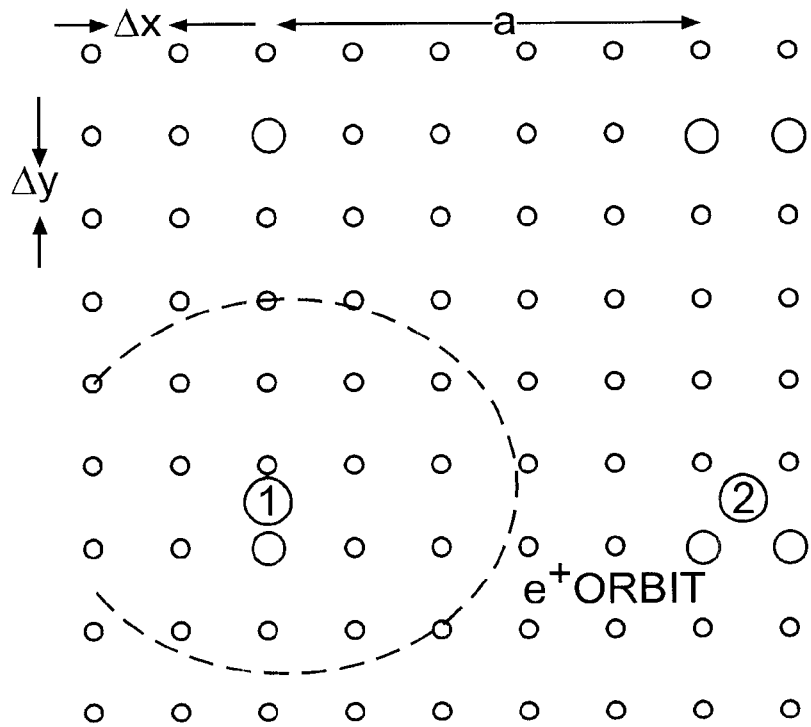
FIG. 3A is a simplified plan view in simplified form of a section of a multi-tip array of the present invention that includes inverse artificial atoms and artificial inverse diatomic molecules.
Figure 3B:
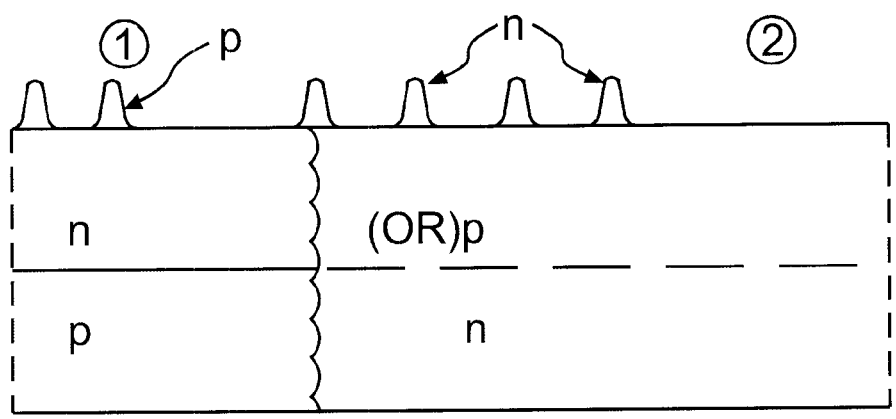
FIG. 3B is a cross-sectional view of the section of the multi-tip array of FIG. 3A.

The present invention also encompasses multi-tip arrays that behave as inverse artificial molecules. Such inverse artificial molecules may be formed when only one, two or more tips are removed from a complete array of tips in a regular grid pattern as shown in FIGS. 3A and 3B. If a missing or anti-tip region is an acceptor type region, the missing region may take on a negative charge by extracting an electron from one or more neighboring tips to create a hole in the surrounding tip crystal. One example of such an acceptor region is where the tips are an n-type semiconductor and the substrate is a p-type semiconductor. As the hole in the surrounding tip crystal moves from tip to tip around the negatively charged anti-tip, an inverse artificial H-atom is formed. More complex inverse-molecules may also be produced by removing two or more neighboring tips form the tip array which is also illustrated in FIG. 3A and FIG. 3B.

The artificial atoms, artificial molecules, inverse artificial atoms, and inverse artificial molecules described above may be used as sensors for various elements and molecules in gases or liquids. The artificial atoms, artificial molecules, inverse artificial atoms, and inverse artificial molecules will act as sensors for gases or liquids that modify the electron and hole orbits around the tips or anti-tips. The character of the original tips structures or the gas-exposed structures may be detected by such conventional methods such as measuring the localized luminescent character, by the measuring the electrical effect on closely neighboring MOSFETs, by monitoring the gas composition with a closely juxtaposed CCD-type detector, etc. An efficient way to setup a sensor employing artificial atoms, artificial molecules, inverse artificial atoms, and inverse artificial molecules would be to arrange columns of a given artificial atom type, artificial molecule type, inverse artificial atoms or inverse artificial molecules.

Multi-tip arrays of the present invention may be used in a variety of applications. For example, multi-tip arrays may be used to cut DNA or other long chain or elongated molecules such as carbon nanotubes into equal or different length segments. The long chain molecules may be cut into segments using an electric field to stretch the long chain molecules out and laying out the long chain molecules in Si or $SiO_2$ templates to cut the DNA into segments of predetermined lengths. The method for forming such Si or $SiO_2$ templates is described in U.S. patent application Ser. No. 09/187,730, filed Nov. 9, 1998, the entire contents and disclosure of which is hereby incorporated by reference. When carbon nanotubes are the elongated molecules being cut, the cut segments may be deposited into grooves of a substrate including atomic ridges and used to form MOSFETs as described in the concurrently filed U.S. Patent Application entitled "Strongly Textured Atomic Ridge (STAR) and Dot (STARDOT) MOSFETs, Sensors, and Filters," the entire disclosure and contents of which is hereby incorporated by reference.

Figure 4:
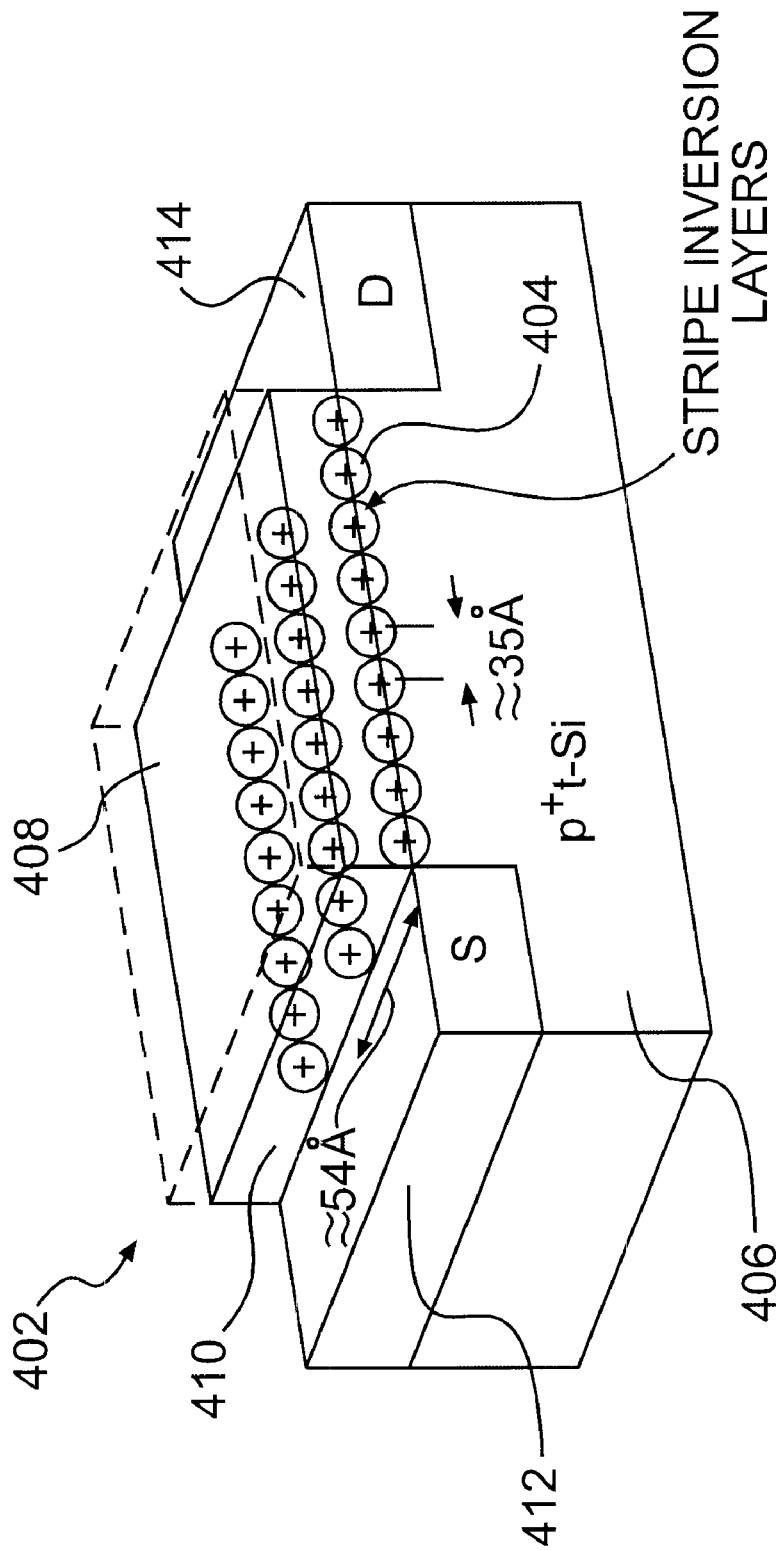
FIG. 4 is a simplified perspective view of a MOSFET that includes a linear array of surface states at the oxide-Si interface of the present invention.

The multi-tip arrays of the present invention may be used to arbitrarily SCULPT integrated circuits and devices on a scale of nanometers. And example of such a single electron type of device having many parallel ultra-thin metal or inversion or accumulation layers is shown in FIG. 4 Such a device employing Au or Ag atomic dots may be heated electrostatically to a temperature of 300° C. to lift Au or Ag toward the gate metal interface with a $-V_g$ bias. This will allow adjustment of the threshold voltage $V_t$ by reducing the effective surface state density $Q_{ss}$. The latter process may reduce the $\sim 10^{15}/cm^2$ values of $Q_{ss}$ of the metal monolayers to much more tractable values of $10^{11}$ to $10^{12}/cm^2$ that will keep the inversion layers from overlapping.

A related method for adjusting $V_t$ that does not necessarily involve SCULPT uses Ag nanowires of the type described in the concurrently filed U.S. Patent Application entitled "Strongly Textured Atomic Ridge and Dot Fabrication", the entire disclosure and contents of which is hereby incorporated by reference. A small amount of Au, on the order of 0.001 ML is deposited on the Ag nanowires. The Ag is removed by conventional wet chemistry (e. g., nitric acid) methods without removing the Au. The amount of remaining Au may be further controlled by additional cleaning or by heating to 300° C. using an electric-field movement as described above to ensure overlap or near overlap of the individual ion induced inversion layer regions of a MOSFET. FIG. 4 illustrates such a MOSFET 402 including an inversion layer 404 underneath the +charged remaining Au ions at the interface. MOSFET 402 also includes a p-type Si substrate 406, a gate conductor 408, a layer of dielectric material 410, a source 412 and a drain 414. The ability to used a metallic template, such as the Au inversion layers shown in FIG. 4, to geometrically control the position and quantity of $Q_{ss}$ in a MOSFET is a significant advance in the field of MOSFET design and provides an important new control parameter for IC chip manufacture. It is also possible to use the SCULPT process to tailor the spacing and density of the Ag or Au charged states. It is important to note that the induced inversion layers in FIG. 4 are aligned in straight lines and no STAR etching is involved.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A multi-tip array device comprising:

a substrate;

a multi-tip array of atomic tips on said substrate, said multi-tip array having a pitch of 0.94 to 5.4 nm between adjacent tips in at least one direction; and means for moving said substrate, wherein said multi-tip array includes at least one anti-tip.

2. The multi-tip array of claim 1, wherein said multi-tip array has a pitch of 0.04 to 5.4 nm between adjacent tips in at least two perpendicular directions.

3. The multi-tip array of claim 1, wherein said multi-tip array includes a plurality of anti-tips.

4. The multi-tip array of claim 1, said means for moving said substrate is capable of moving said substrate in two perpendicular directions.

5. An atomic claw comprising:

a mounting block;

a paddle having a multi-tip array thereon, said multi-tip array having a pitch of 0.94 to 5.4 nm between adjacent tips in at least one direction; and a cantilever connected to said paddle and said mounting block, wherein said cantilever allows said paddle to be moved in at least one arcuate direction, wherein said multi-tip array includes at least one anti-tip.

6. The atomic claw of claim 5, wherein said cantilever allows said paddle to be moved in a first arcuate direction in a first plane and in a second arcuate direction in a second plane perpendicular to said first plane.

7. The atomic claw of claim 5, wherein said multi-tip array has a pitch of 0.94 to 5.4 nm between adjacent tips in at least two perpendicular directions.

8. The atomic claw of claim 5, wherein said multi-tip array includes a plurality of anti-tips.

* * * * *